United States Patent [19]
Ho et al.

[11] Patent Number: 5,882,537
[45] Date of Patent: Mar. 16, 1999

[54] METALLIC PRECIPITATE MONITORING METHOD

[75] Inventors: Yueh-Feng Ho, Hsinchu; Chia-Chieh Yu, Taipei, both of Taiwan

[73] Assignee: United Microelectronic Corp., Taiwan

[21] Appl. No.: 755,905

[22] Filed: Nov. 25, 1996

[51] Int. Cl.⁶ .......................... H01L 21/00; H01L 21/306
[52] U.S. Cl. ................. 216/59; 216/58; 216/60; 216/61
[58] Field of Search ................. 216/59, 58, 60, 216/61; 156/626.1, 646.1, 628.1

[56] References Cited

U.S. PATENT DOCUMENTS

| | | | |
|---|---|---|---|
| 4,873,176 | 10/1989 | Fisher | 430/313 |
| 5,139,904 | 8/1992 | Auda et al. | 430/30 |
| 5,298,112 | 3/1994 | Hayasaka et al. | 156/643 |
| 5,320,707 | 6/1994 | Kanekiyo et al. | 156/665 |
| 5,421,934 | 6/1995 | Misaka et al. | 216/59 |
| 5,458,731 | 10/1995 | Roman et al. | 216/59 |
| 5,707,487 | 1/1998 | Hori et al. | 156/659.11 |
| 5,733,820 | 3/1998 | Adachi et al. | 156/625.1 |

*Primary Examiner*—Matthew V. Grumbling
*Attorney, Agent, or Firm*—Hayes, Soloway, Hennessey, Grossman & Hage, P.C.

[57] ABSTRACT

Disclosed is a method of etching which makes the quantitative analysis possible and easier. In the prior art, chemical plasma etching is mainly by ion bombardment, and the tool used to observe the metal bulk is transmission electron microscopy (TEM), so it is very difficult and complicated to execute quantitative analysis. By using chemical plasma etching, the metal precipitate will be left almost all at the end of etching. Scanning electron microscopy (SEM) is used instead of TEM to perform the quantitative analysis.

10 Claims, 5 Drawing Sheets

METALLIC PRECIPITATE MONITORING METHOD

BACKGROUND OF THE INVENTION

1. Field of the Invention

The present invention relates to a method for examining the metallic precipitate on grain boundary (GB) and heterogeneous grain growth (GG). Particularly, the present invention relates to a method for utilizing the partial etching using chemical plasma (less ion bombardment) and scanning electron-microscope (SEM) to observe the metallic precipitate easily and efficiently.

2. Description of the Prior Art

As bipolar technology advances, smaller sized devices and circuits with higher functional densities are implemented. In the course of integrated-circuit evolution, the maximum number of devices per chip has steadily increased while the number of the metal pitches has steadily decreased, mainly because of the increase in functional density. The metal pitches is defined as the summation of linewidth and the width between two neighboring metal lines. In the year of 1970s the metal pitch is about the order of 10 $\mu$m, yet as the functional density raises, the metal pitch is down to the order below 1 $\mu$m.

The density of a device of the most advanced circuits is limited by the area occupied by the interconnect paths. Anisotropic etching of the metal layers permits the use of smaller minimum metal pitches to increase the interconnect capability. Thus, the isotropic nature of aluminum wet etching processes renders them inadequate for VLSI applications, and it requires a direct dry etching process. The gas mixtures 10 (neglecting rare gas diluents) including $BCl_3 + Cl_2$ are used in the prior art to successfully etch the aluminum. The equipment used to implement the chemical plasma etching is shown in FIG. 1.

Some materials are added to the aluminum to improve some of its properties. For example 1–2% silicon is often added to prevent the aluminum from spiking near shallow junctions. In addition 2–4% copper or 0. 1–0.5% Ti(often together with Si) are usually added to enhance the electromigration resistance of the aluminum. Since $SiCl_4$ is volatile at room temperature, Al—Si films are readily etchable in chlorine-containing gases. Titanium also forms volatile etch products ($TiCl_4$) which dose not pose a problem. The copper, on the other hand, reacts with the chlorine to form an etching product CuCl, which is relatively non-volatile below 175° C. The copper containing residues often remains after these alloy films were dry-etched, so it is more difficult to use the chlorine plasmas to perform the etch step. The degree of difficulty increases with the increased Cu concentration and 4% Cu-containing films being quite a severe challenge. The successive processes illustrating chemical plasma etching of the wafer without eliminating Cu precipitate are shown from FIG. 2(*a*) to FIG. 2(*c*). In FIG. 2(*a*), at the point 24 where segregation occurred in the Al—Cu alloy film 22, the etching rate is different from that of elsewhere in the Al—Cu alloy film 22.

FIG. 2(*b*) shows how the Cu precipitates are produced during the etching process, it also shows that some points possess different etching rate and act as a mask that is called as a micro masking which produces unwanted particles. FIG. 2(*c*) shows the end point of the chemical plasma etching and the foregoing conduction is called 'bridging issue', which causes short-circuit between the metal lines 28 and 29. Two methods are used to promote CuCl desorption during the chemical plasma etching: heating the substrate to the temperature commensurate with the maximum temperature that the resist material is allowed to be used, or enhancing the ionic bombardment of the surface so that the significant sputtering may occur. FIG. 3 is a cross-sectional view of a wafer after the enhanced chemical plasma etching with the copper precipitate eliminated. During the sputter deposition of Al—Cu alloy film, copper segregation occurred at the grain boundary of aluminum atoms, and the Cu precipitation resides after ion bombardment. The chemical plasma etching utilized to perform dry etching Al—Cu alloy film is intentionally set in the environment that produces ion bombardment so the copper precipitate is thus partly eliminated. After the etching process, the TEM is used to perform the quantitative analysis.

To perform the quantitative analysis, the method transmission electron microscopy (TEM) is often used. The TEM offers the maximum resolution of 2 angstrom. The image in the TEM is produced by the differential loss of electrons from an incident beam(60–350 keV, electron wavelength ~0.04 angstrom)as it passes through very thin samples. The sample must be thin enough to transmit the beam so, that the essential information caused by differences in sample thickness, phase composition, crystal structure, and orientation is preserved. In a conventional TEM, the electron beam is focused by a condenser lens, then passes through the sample and is imaged onto a photographic plate or fluorescent screen. The contrast in a TEM image arises for different reasons in samples of crystalline and amorphous materials. In crystalline layers, the incident electron beam is diffracted by the material. Abrupt changes in thickness, path structure, or crystallographic orientation to cause corresponding changes in contrast and these crystallographic feature can be easily imaged at high resolution. In amorphous regions, contrast is obtained from samples of different thickness or different chemical or phase composition.

Though TEM is a very useful tool for measuring the number of Cu precipitate, it is not widely used in spite of its excellent resolution and analytical capabilities. There are two reasons why the TEM is not widely used. The first reason is the difficulties involved in preparing the required thin samples. The second reason is the difficulties involved in correctly interpreting TEM images. Relating to the sample preparation problem, it needs to insure that the feature of interest is present with the sample region that has been thinned and prepared for TEM analysis. The most favorable TEM sample sections to VLSI studies are vertical cross-sections. It take several hours to prepare ion mill samples of the necessary thickness, and the preparation is an arduous task. According to the process mentioned above, it is hard to perform the quantitative analysis of copper precipitate in the prior art, because it is partially eliminated from the ion bombardment during the process of chemical plasma etching. In addition, the sample preparation is very complicated, it takes almost one day to examine the copper precipitate by TEM.

SUMMARY OF THE INVENTION

As described in the previous section, it is very difficult to perform the quantitative analysis by the process in the prior art, so it is necessary to provide another process to perform the chemical etching which is isotropic etching. Thus the copper precipitate would not be eliminated during the process of chemical etching.

The present invention utilizes the gas mixtures chlorine and nitrogen to perform chemical plasma etching which will not eliminate copper precipitate. The scanning electron microscopy(SEM) can be used to observe the copper precipitates after etching, thus the process of quantitative analysis is much more easier. It takes only 1 hour to finish the quantitative analysis of copper precipitate on Al—Cu alloy. The result of quantitative analysis can be referred to whether the sputtering process should be improved and to what extent it should be improved.

BRIEF DESCRIPTION OF THE DRAWINGS

The above features of the present invention will be more clearly understood from consideration of the following descriptions in connection with the accompanied drawings in which.

DESCRIPTION OF THE PREFERRED EMBODIMENT

Figure 1:
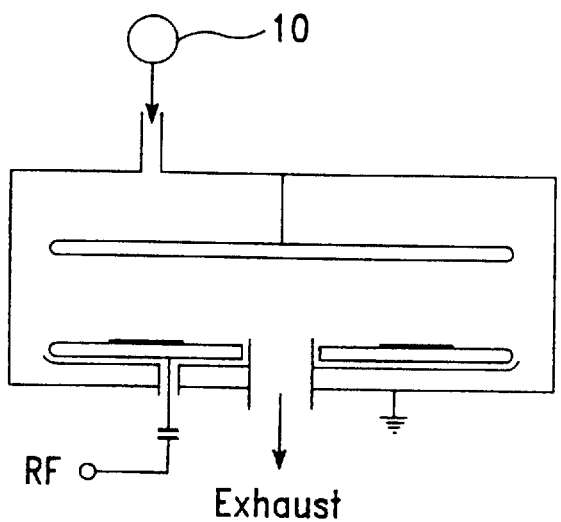
FIG. 1 is a cross-sectional view of a wafer reactor in the prior art.
Figure 2A:
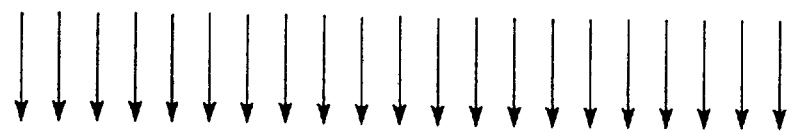
FIG. 2(a) is a cross-sectional view of a wafer before the traditional chemical plasma etching.
Figure 2A:
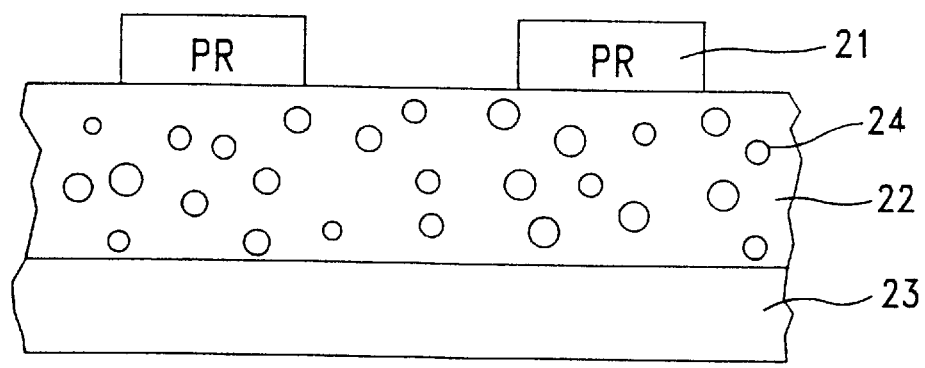
Figure 2B:
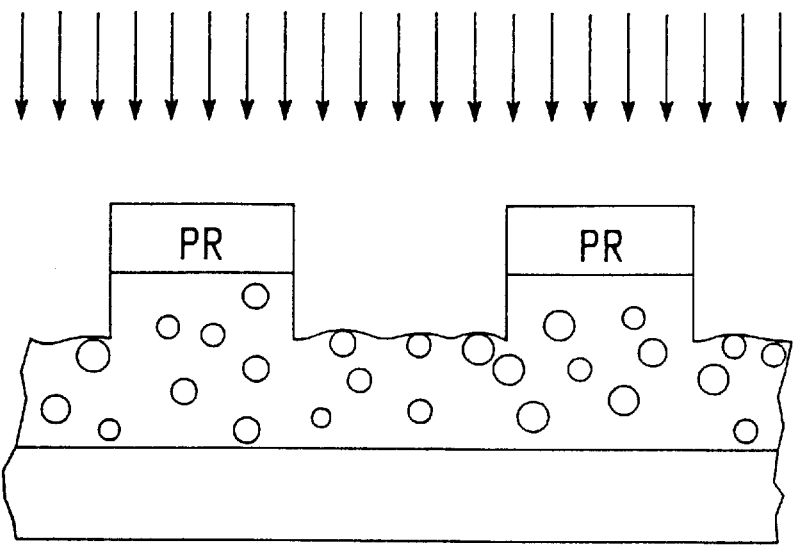
FIG. 2(b) is a cross-sectional view of a wafer during the traditional chemical plasma etching with micro-masking effect.
Figure 2C:
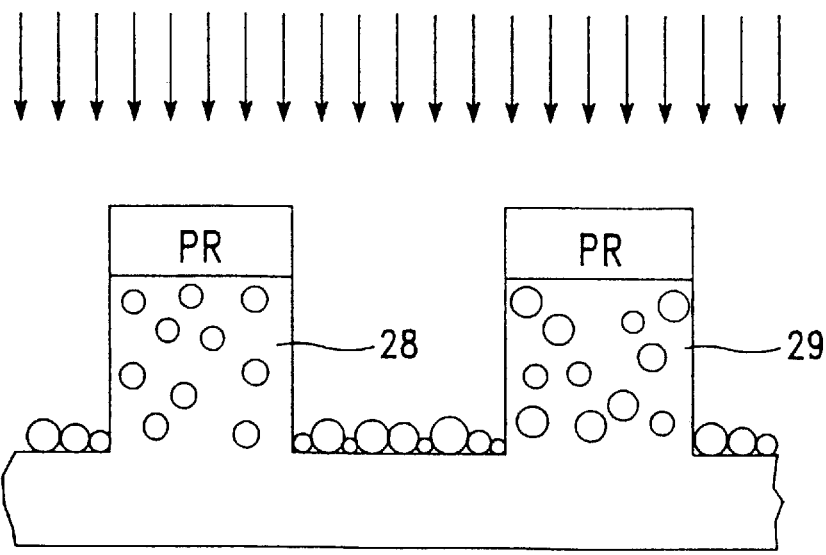
FIG. 2(c) is a cross-sectional view of a wafer after the traditional chemical plasma etching with copper precipitate.
Figure 3:
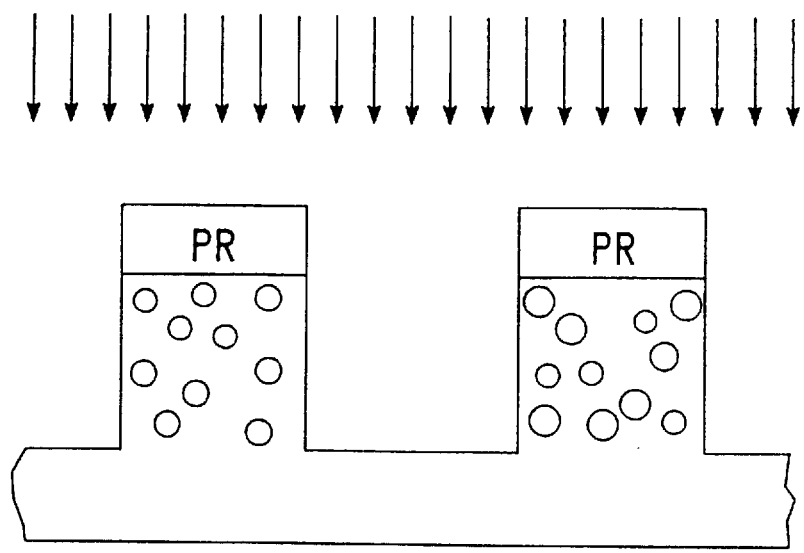
FIG. 3 is a cross-sectional view of a wafer after the enhanced chemical plasma etching with the copper precipitate eliminated.
Figure 4:
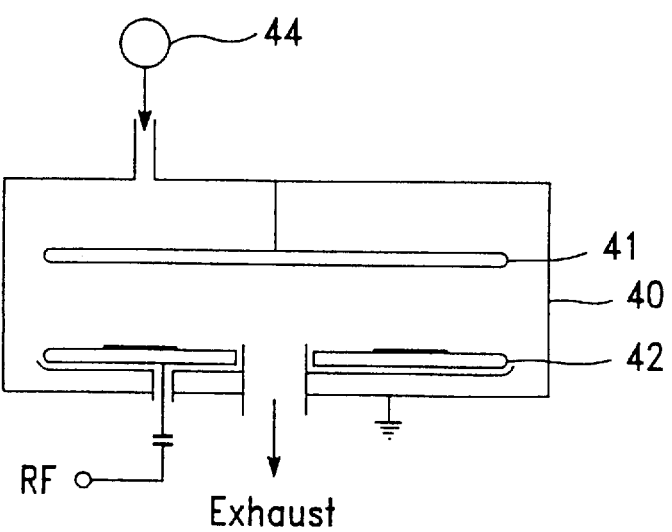
FIG. 4 is a cross-sectional view of a wafer reactor in the present invention.

The making and using of the present preferred embodiment are discussed below in detail. FIG. 4 shows the equipment that used to implement the chemical plasma etching which is isotropic. The gas mixtures 44 include the chlorine and the nitrogen, the temperature of the chamber 40 is set to be 70° C., the temperature of the upper electrode 41 is set to be 70° C., and the temperature of the bottom electrode 42 is set to be 60° C. The power of the bottom electrode 42 is set to be 200 Watt, the pressure of the gas mixtures 44 in the chamber 40 is set to be 1.5 mtorr, the flow rate of the chlorine is set to be 90 sccm, and the flow rate of the nitrogen is set to be 16 sccm. Under such conditions, the improved chemical plasma etching can be executed.

Figure 5A:
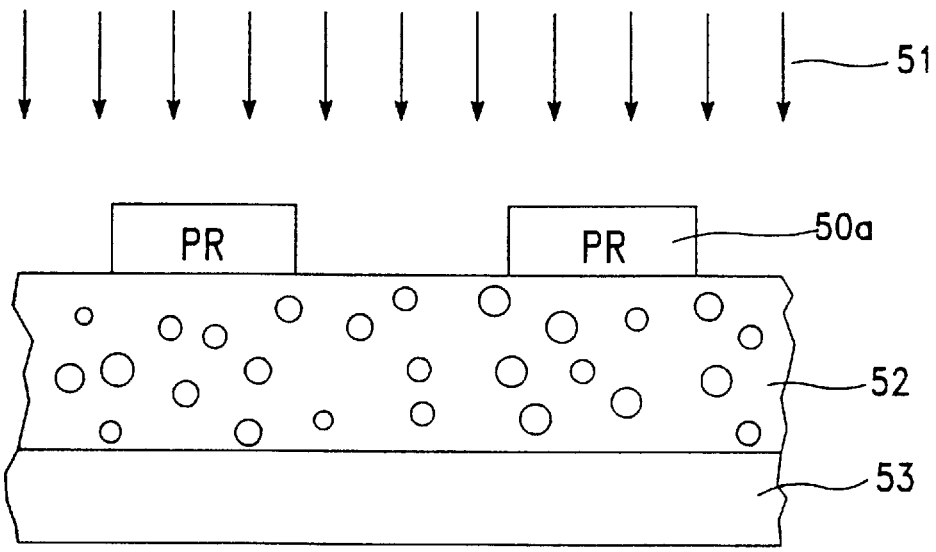
FIG. 5(a) is a cross-sectional view of a wafer before the improved chemical plasma etching.
Figure 5B:
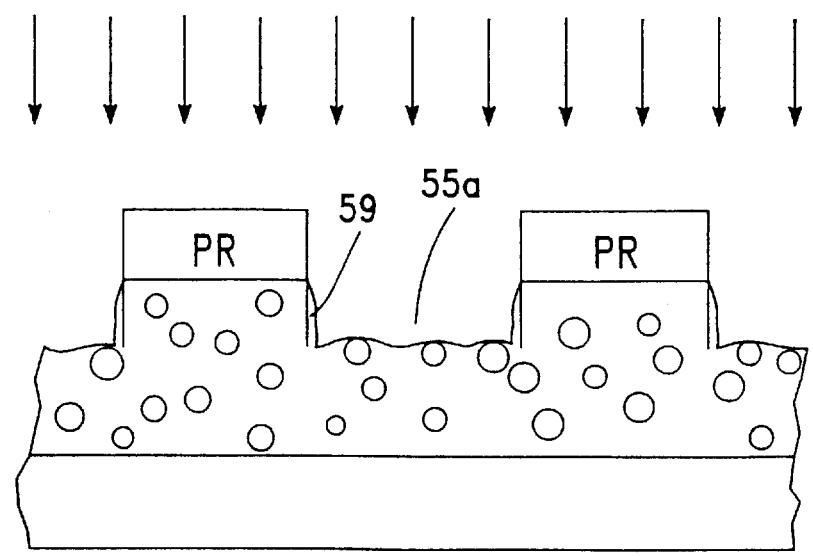
FIG. 5(b) is a cross-sectional view of a wafer during the improved chemical plasma etching with micro-masking effect.

As shown in FIG. 5(a), the little ion bombardment is produced, and the chlorine ion 51 impacts the photoresist 50a as well as the Al—Cu alloy film 52. The thickness of the Al—Cu alloy film 52 is 8,000 angstrom, and the barrier layer 53 below the Al—Cu alloy film 52 is composed of titanium nitride (TiN). As the process of plasma etching proceeds, the exposed Al—Cu film 52 without the coverage of the photoresist 50a is etched, which is shown in FIG. 5(b). In addition some photoresist flow down the space 55a along the side wall 59 due to the little ion bombardment. The photoresist which covers the side wall 59 prevents the part of the AlCu alloy inside the film 52 side wall 59 from etching, so the etching process acts as an anisotropic etching. Because the ion used to perform the etching step is just a little, the etching mechanism is mainly chemical plasma etching (isotropic etching) not ion bombardment (anisotropic etching).

Figure 5C:
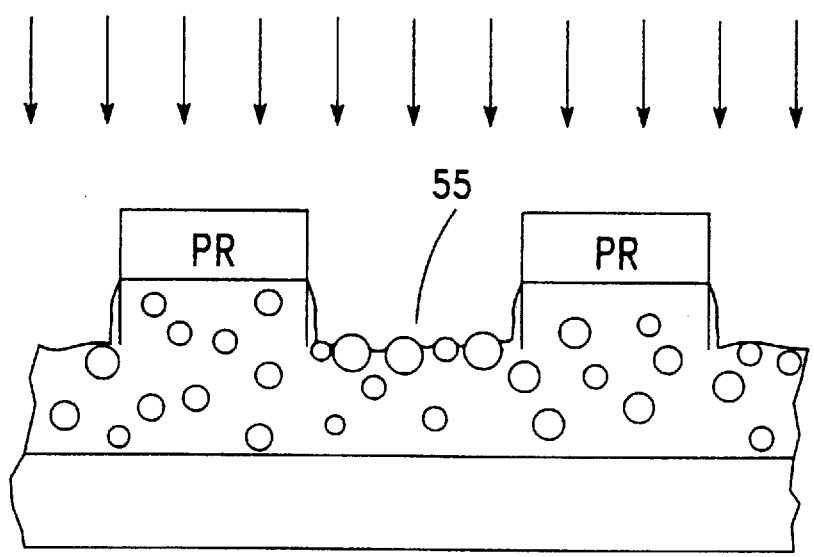
FIG. 5(c) is a cross-sectional view of a wafer after the improved chemical plasma etching with copper precipitate.

The etching process proceeds until the depth of space 55 equals 4,000 angstrom, namely, half of the thickness of the Al—Cu alloy film 52 (shown in FIG. 5(a)), the cross-sectional view of the wafer is shown in FIG. 5(c). As illustrated in FIG. 5(c), the copper precipitates are left at the bottom of the space 55. By the way, it is verified that the copper precipitate is conceived in the Al—Cu alloy film 52 during the sputter deposition process. Since almost none of the copper precipitate is eliminated during the process of etching, the quantitative analysis is thus made possible and easier. By using the SEM, the observing process is much more easier than that of the TEM, and the result is even more precise.

The scanning electron microscopy is an important tool for the VLSI analysis, because the SEM has the capability of providing much higher magnification, resolution, and depth of field than optical microscopy. The resolution of the SEM can be up to 10 angstrom (100 angstrom is routine), the magnification is from 10× to 100,000× (a few instrument up to 300,000×). The depth of the fields of 2–4 $\mu$m is at 10,000×, and depth of the fields of 0.2–0.4 mm is at 100×. The high depth of field makes SEM especially useful for high magnification(i.e. >2,000×) and examination of VLSI device surfaces where film thickness rarely exceeds 1 $\mu$m.

Because there is no need to prepare for the sample that is observed using the TEM, the present invention can reduce the time for observing the precipitate in the sample. The wafer used in this preferred embodiment is called control wafer. After the quantitative analysis of the control wafer is finished, the result is used to improve the sputtering deposition forming the Al—Cu alloy film. Then the suggested sputter deposition is used to form the other wafer and the foregoing etching process as well as the quantitative analysis mentioned above are used to improve the deposition process forming another wafer. This foregoing cycle continued until the number of copper precipitate is decreased to the minimum value. Since the process of sputter deposition is improved to the best extent, the process can be used to raise the yield of manufacture.

Although specific embodiments have been illustrated and described, it will be obvious to those skilled in the art and various modification may be made without departing from the spirit which is intended to be limited solely by the appended claims.

What is claimed is:

1. A method of analyzing a metal precipitation for a metal alloy film, said method comprising the steps of:

pumping a plurality of gas mixtures into a chamber;

etching a portion of said metal alloy film, said etching step utilizing said plurality of gas mixtures as an etchant to etch said metal alloy film, wherein said etching step comprises: setting a pressure at about 15 mtorr of said gas mixtures in said chamber and etching said metal alloy film until half of said metal alloy film in thickness is reached; and observing said wafer after said portion of said metal alloy film is etched, said observing step using a SEM (Scanning Electron Microscopy) to count a number of said metal precipitation.

2. The method as claim 1, wherein said gas mixtures contain chlorine and nitrogen.

3. The method as claim 2, wherein said chlorine is at the flow rate of 90 sccm.

4. The method as claim 2, wherein said nitrogen is at the flow rate of 16 sccm.

5. A method of analyzing a metal precipitation for a metal alloy film on a wafer, said method comprising the steps of:

pumping a plurality of gas mixtures containing chlorine and nitrogen into a chamber;

etching a portion of said metal alloy film, said etching step utilizing said plurality of gas mixtures as an etchant to etch said metal alloy film, wherein said etching step comprises: setting a pressure at about 15 mtorr of said gas mixtures in said chamber and etching said metal alloy film until half of said metal alloy film in thickness is reached; and observing said wafer after said portion of said metal alloy film is etched, said observing step using a SEM (Scanning Electron Microscopy) to count a number of said metal precipitation.

6. The method as claim 5, wherein said chlorine is at a flow rate of 90 sccm.

7. The method as claim 5, wherein said nitrogen is at a flow rate of 16 sccm.

8. A method of analyzing a metal precipitation for a metal alloy film on a wafer, said method comprising the steps of:

pumping a plurality of gas mixtures containing chlorine and nitrogen into a chamber;

etching a portion of said metal alloy film, said chlorine being at a flow rate of 90 sccm, said nitrogen being at a flow rate of 16 sccm, said etching step utilizing said plurality of gas mixtures as an etchant to etch said metal alloy film, wherein said etching step comprises: setting a pressure at about 15 mtorr of said gas mixtures in said chamber and etching said metal alloy film until half of said metal alloy film in thickness is reached; and observing said wafer after said metal alloy film is etched, said observing step using a SEM (Scanning Electron Microscopy) to count a number of said metal precipitation.

9. The method as claim 1, wherein chlorine is at a flow rate of 90 sccm.

10. The method as claim 1, wherein nitrogen is at a flow rate of 16 sccm.

* * * * *

UNITED STATES PATENT AND TRADEMARK OFFICE
CERTIFICATE OF CORRECTION

PATENT NO. : 5,882,537
DATED : March 16, 1999
INVENTOR(S) : Ho et al

It is certified that error appears in the above-identified patent and that said Letters Patent is hereby corrected as shown below:

Claim 9, Col. 6, line 17, "1" should be - -8- -.

Claim 10, Col. 6, line 19, "1" should be - -8- -.

Signed and Sealed this

Fourteenth Day of December, 1999

Attest:

Q. TODD DICKINSON

Attesting Officer

Acting Commissioner of Patents and Trademarks